United States Patent [19]

Dierich et al.

[11] Patent Number: 5,002,441
[45] Date of Patent: * Mar. 26, 1991

[54] DRILLING UNIT

[75] Inventors: Dieter Dierich, Holzgerlingen; Walter Rotter, Schoenaich; Conrad Trollmann, Hildrizhausen; Hermann Wilken, Tettnang, all of Fed. Rep. of Germany

[73] Assignee: International Business Machines Corporation, Armonk, N.Y.

[ * ] Notice: The portion of the term of this patent subsequent to Apr. 3, 2007 has been disclaimed.

[21] Appl. No.: 466,117

[22] Filed: Nov. 16, 1989

[30] Foreign Application Priority Data

Apr. 17, 1987 [EP] European Pat. Off. ........ 87105751.9

[51] Int. Cl.⁵ .......................................... B23B 47/22
[52] U.S. Cl. ..................................... 408/130; 408/10; 408/13
[58] Field of Search ........................ 408/130, 14, 5–7, 408/10, 13; 92/108, 116, 111

[56] References Cited

U.S. PATENT DOCUMENTS

| 2,488,992 | 11/1949 | Taylor | 408/130 X |
|---|---|---|---|
| 2,604,759 | 7/1952 | Smith | 408/14 X |
| 3,266,580 | 8/1966 | Clapp et al. | 173/19 |
| 3,362,266 | 1/1968 | Krafft | 408/130 X |
| 3,797,955 | 3/1974 | Peddinghaus et al. | 408/130 X |
| 4,119,017 | 10/1978 | Nusbaumer et al. | 92/108 |
| 4,157,231 | 6/1979 | Phillips | 408/11 X |
| 4,257,489 | 3/1981 | Westerberg | 173/159 |
| 4,913,600 | 4/1990 | Dierich et al. | 92/108 X |

FOREIGN PATENT DOCUMENTS

| 1602898 | 8/1970 | Fed. Rep. of Germany . |
|---|---|---|
| 1602848 | 1/1971 | Fed. Rep. of Germany . |
| 2108431 | 12/1971 | Fed. Rep. of Germany . |
| 2411053 | 7/1979 | France . |
| 56-139848 | 10/1981 | Japan . |
| 58-114802 | 7/1983 | Japan . |
| 58-114803 | 7/1983 | Japan . |
| 59-030634 | 2/1984 | Japan . |
| 60-259346 | 12/1985 | Japan . |
| 857079 | 12/1960 | United Kingdom ............ 408/14 |

OTHER PUBLICATIONS

"Der Luft ein Schnippchen Geschlagen", Roboter 2/83, pp. 66–67, Germany.
"Fluid-Lern Program: Hydraulik" Moderne Industrie, c. 1973, p. 83, FIG. 1.2.2, Germany: (Reproduction of German Industrial Norm DIN 24 300, leaflet 3, p. 5, No. 1.2.2).

Primary Examiner—Larry I. Schwartz
Assistant Examiner—Robert Schultz
Attorney, Agent, or Firm—Lawrence R. Fraley

[57] ABSTRACT

A drilling unit comprises a housing (5), a drilling spindle housing means (3) axially moveable within said housing (5), a drilling spindle (2) rotatably received within said housing (5) and driven by a driving means (12), a plunger (15) connected to the drilling spindle housing means (3) and piston means (22) slideably received within said housing (5) and operatively connected to the plunger (15). The plunger (15) is connected to the piston means (22) with a first clearance (51) in a plane normal to the direction (A) of the axial movement of the plunger. The piston means (22) further is connected to the plunger (15) with a second clearance (52) in the direction of the axis (A) of said drilling unit.

The drilling unit exhibits excellent linearity of axial motion combined with a high degree of accuracy and, at the same time, requires as little space as possible in a plane parallel to a plane, in which a workpiece is positioned.

2 Claims, 3 Drawing Sheets

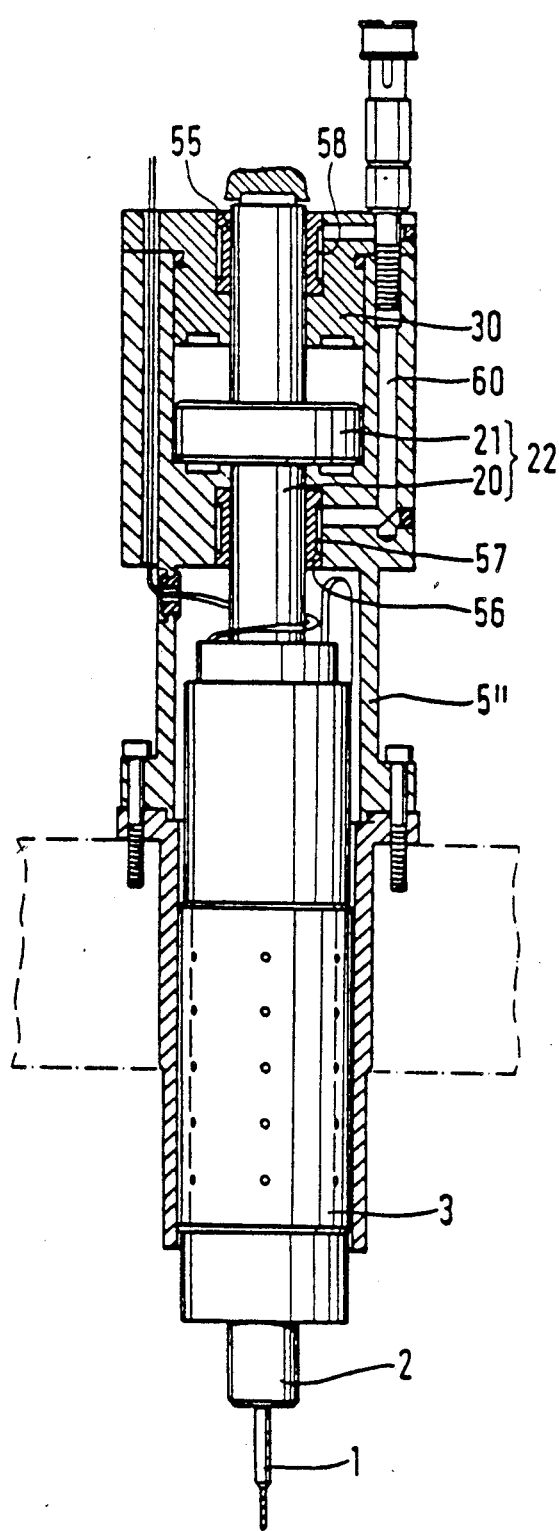
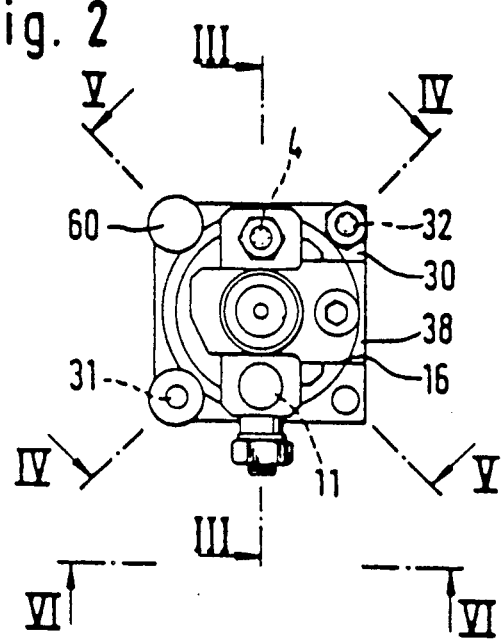
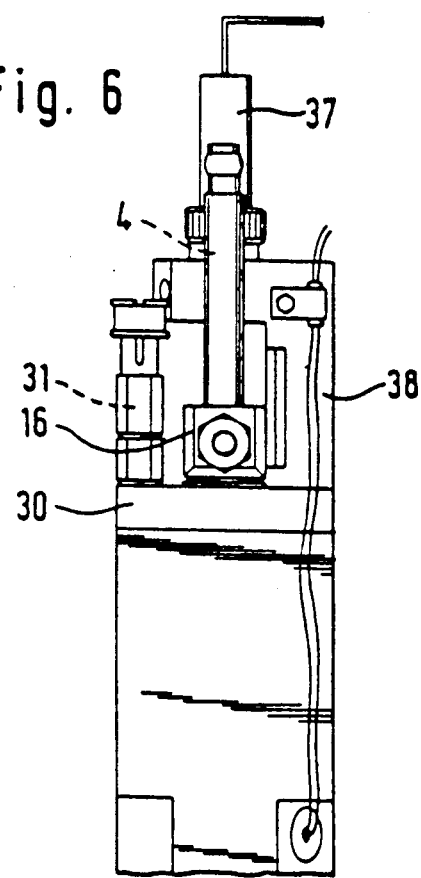

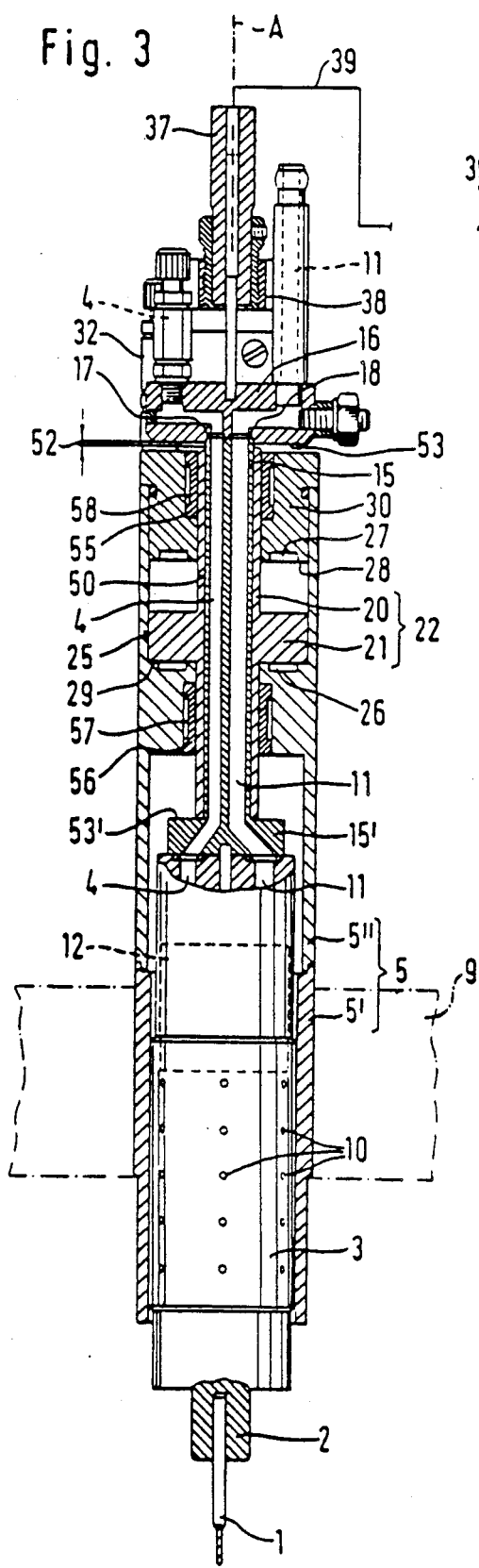
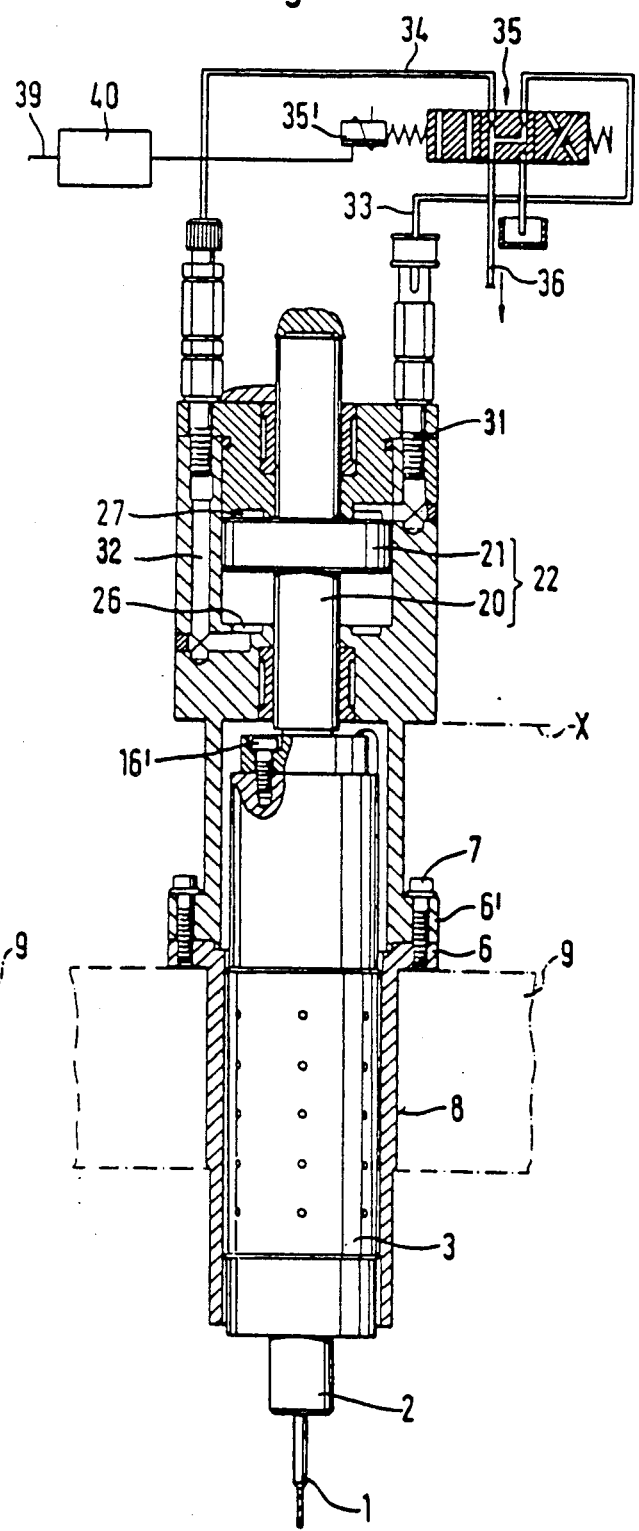

DRILLING UNIT

CROSS-REFERENCE TO RELATED APPLICATIONS

This application is related to U.S. application Ser. No. 173,321, filed Mar. 25, 1988 and European Patent Application P No. 87105751.9 filed Apr. 17, 1987. Ser. No. 173,321 is now U.S. Pat. No. 4,913,600, having issued on Apr. 3, 1990.

BACKGROUND OF THE INVENTION

1. Field of the Invention

The invention relates to drilling unit apparatus and more particularly to drilling unit apparatus of the type having
a housing;
a drilling spindle housing means axially moveable within said housing;
a drilling spindle rotatably received within said housing and driven by a driving means;
a plunger connected to the drilling spindle housing means and adapted to move axially with the drilling spindle housing means within said housing;
piston means slideably received within said housing and operatively connected to the plunger to move it in upward or downward direction respectively.

2. Description of Related Art

Drilling devices of the aforementioned type are known. One of the purposes, for which they are used, is, within an arrangement of a multiplicity of such drilling units, the boring of holes in printed circuit boards. In this connection it is desirable to reduce the space occupied by one drilling unit as much as possible in order to be able to drill as many holes as possible at the same time, i.e. with one stroke of said multiple drilling units arrangements. Usually, sealing rings or other sealing members provided between the above mentioned parts of the drilling unit require additional space in a plane extending parallel to the printed circuit boards and thereby limit the number of units to be put together and thereby also limit the number of holes, which can be drilled into one board simultaneously.

If the accuracy, with which the drilling tool of such drilling unit can be fed to a particular spot of such printed circuit board, is to be increased, it is necessary to increase the accuracy of the bearing surfaces for the drilling spindle housing means, within said aforementioned housing. This requires an increase of the accuracy of the bearing means, within which the afore said spindle housing and said plunger move. However, when the accuracy of these parts, especially the bearing surfaces extending in axial direction, is increased, it appears that even slight misalignments between the plunger and the drilling spindle housing means, which form a unit and/or between the surfaces, which form bearing means for parts of said unit, lead to clamping, jamming, or blocking of the one of the mentioned components against another one.

A further problem with drilling units of the aforementioned type appears as a consequence of the fact that sealing means mostly are as gaskets. Irregularities of movement of the drilling spindle housing, within said aforementioned housing can occur, since gaskets of elastic material (such as e.g. plastic or rubber) have a tendency to stick to metallic surfaces, which move relative to them. Therefore, the motion of the drilling spindle will be irregular, i.e. interrupted by jerks or the like. Since modern printed circuit boards involve a plurality of layers of different materials, in which it is absolutely essential that accuracy of depth of drilling can be accuractly controlled, it is necessary to avoid such jerks or similar irregularities.

SUMMARY OF THE INVENTION

It is, therefore, the object of the present invention to provide a drilling unit of the above mentioned type, which does not have the described disadvantages of the prior art, i.e. which exhibits excellent linearity (no jerking, sticking or jamming) of axial motion combined with a high degree of accuracy, and which, at the same time, requires as little space as possible in a plane parallel to a plane, in which a workpiece (e.g. a printed circuit board) is positioned.

At the same time, the bearing should not be blocked by the aforementioned misalignments.

In accordance to the invention, the above mentioned objects are achieved in that the plunger is connected to the piston with a first clearance in a plane normal to the direction of the axial movement of the plunger to allow a certain relative movement of the plunger with respect to the piston within said plane and that the piston further is connected to the plunger with a second clearance in the direction of the axis of said drilling unit to allow a certain further relative movement of the plunger with respect to the piston in axial direction.

The features of the invention are set forth in the following description of the preferred embodiment and in the claims.

BRIEF DESCRIPTION OF THE DRAWING

An embodiment of the invention and its advantageous improvements will be described in the following with reference to the Figures, in which:

FIG. 2 is a top plan view of a practical embodiment of the invention;

FIG. 3 is a sectional view along the lines III—III in FIG. 2;

FIG. 4 is a sectional view along the lines IV—IV in FIG. 2;

FIG. 5 is a sectional view along the lines V—V in FIG. 2;

FIG. 6 is a view in the direction of arrows VI—VI in FIG. 2.

DESCRIPTION OF THE PREFERRED EMBODIMENT

Figure 1:
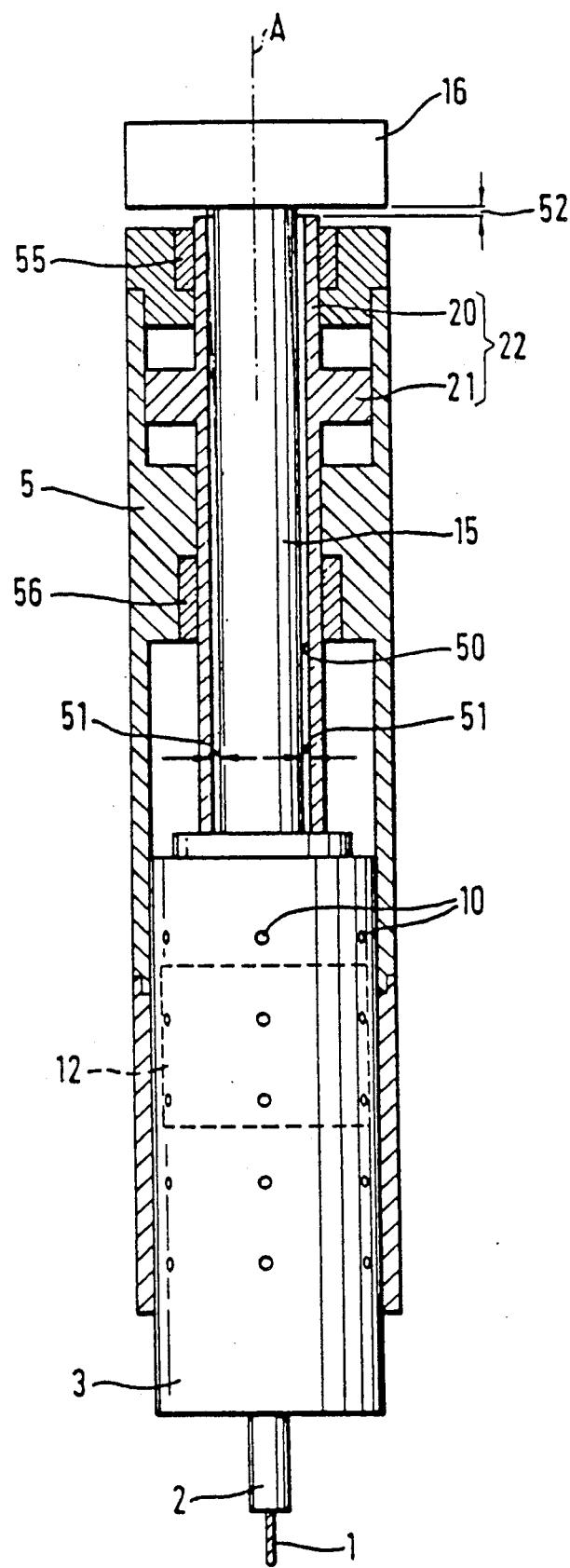
FIG. 1 is a diagrammatic view of the embodiment, indicating clearances 51 and 52 in exaggerated form.

As best shown in FIG. 3, a drilling tool 1 is received in a drilling spindle 2, which again is rotatably received within a tubular spindle housing 3. Said tubular spindle housing 3 contains an air driven drilling spindle driving motor 12 (as indicated by the dashed lines), which may be provided in the form of an air driven turbine, to which the air is supplied through an air supply line 4. The tubular spindle housing 3 is slideably received within a sleeve like housing 5, consisting of a lower member 5' and an upper member 5", which are fixed together by means of lugs 6, 6', connected by screws 7. The lugs 6, at the same time, may serve as an abutment to hold the drilling unit as a whole within an opening 8 provided in a carrier plate 9. The housing is of circular cross-section below line X in FIG. 4; above line X it is of quadratic cross-section (see also FIG. 2).

The tubular spindle housing 3 is received within the lower member 5' of the housing 5. A low friction air bearing is provided between the tubular spindle housing 3 and the interior surface of the lower member 5' of the sleeve like housing 5. To this end, pressurized air is supplied through air supply line 11 to the interior of the tubular spindle housing 3 such that it is pressed through openings 10 to form an air film or cushion between the outer surface of the tubular spindle housing 3 and the interior surface of the lower member 5' of sleeve like housing 5.

A plunger 15 is connected by screws 16' (see FIG. 4) to the tubular spindle housing 3 such that housing 3 and plunger 15 together form one rigid unit, which is moveable back and forth in the direction of axis A to provide for feeding the drilling tool 1 or retracting it respectively to and away from a workpiece (not shown), into which a boring is to be drilled.

Air supply lines 4 and 11 for supplying pressurized air to the motor 12 and the bearing openings 10 respectively also extend through the plunger 15. At its upper end, the plunger 15 is held within a head member 16 and is fixedly connected thereto. O-rings 17 and 18 provide a sealing of channels 4 and 11, which continue within head member 16. It may be understood from the forgoing that the tubular spindle housing 3, the drilling spindle 2, the plunger 15, and the head 16 are moving in the upward and downward directions as a unit.

The plunger 15, with some critical clearances 51, 52 to be explained later, is received within a piston 22, this piston being integrally formed by a sleeve 20 and flange 21. The flange 21 is received within an enlarged cylinder portion 25 formed within upper member 5" of the housing 5 and closing member 30, which is fixedly secured to the upper member 5" of the housing 5. The piston 22 i.e. flange 21 is moveable in the enlarged cylinder portion 25 in the upward and downward directions. For this purpose, annular grooves 26 and 27 are provided in the upper and lower walls 28 and 29 respectively of said cylinder portion 25. As can best be seen from FIG. 4, the lower annular groove 26 is connected to an air supply line 32, whilst the upper annular groove 27 is connected to an air supply line 31. These air supply lines 31, 32 are in connection with pressure supply lines 33, 34, which are connected to and the pressure in which is regulated by a servo valve unit 35 (symbol in accordance to German Industrial Norm DIN 24 300, leaflet 3, page 5, no. 1.2.2.). The servo valve unit 35 is connected with its supply line 36 to a pressure source (not shown). The pressure in pressure supply lines is controlled by the position of a controlling element 35'. Depending from the position of controlling element 35', predetermined pressures are generated within air supply lines 31, 32 or 34, 33 respectively such that a certain pressure difference exists between both of them, which will move the piston 22 in an upward or downward direction respectively. The position of the piston 22 is measured by a linear transducer 37, which is actually a position measuring element, which is held by a bracket 38, connected to the closing member 30 (see FIG. 6). The signal derived by linear transducer 37 is supplied via line 39 to a control unit 40, in which a control signal is derived to control the controlling element 35' of servo unit 35. This arrangement allows to position piston 22 exactly at any desired height intermediate its upper and lower end positions.

The plunger 15 is not fitted tightly within inner boring 50 of piston 22. The plunger 15 rather is received within boring 50 of piston 22 with a clearance 51 of preferably 0.3 mm. It may be in the range of 0.1 to 0.5 mm. Clearance 51 is shown in FIG. 1 in an exaggerated manner. At the same time, there is a clearance 52 of 0.005 to 0.010 mm between the upper end of the sleeve 20 of piston 22 and the flat bottom wall 53 of head member 16. The plunger 15 practically is held with this clearance 52 in a recess in the unit of head member 16 and plunger 15, said recess being defined by wall 53 and surface 53' of flange 15' of plunger 15. Clearance 52 also is demonstrated in an exaggerated manner in FIG. 1. The dimensions given above for clearances 51 and 52 have been chosen for an embodiment, in which the diameter of the housing 5 was e.g. ca. 43 mm, whilst the length of the housing (including members 5' and 5") was approximately 200 mm. These numbers only serve to illustrate the order of magnitude, to which the above identified clearances relate.

These clearances will have the following effects:

If there is an axial misalignment of either one of boring 50, cylindrical wall of enlarged cylinder portion 25, outer cylindrical surface of flange 21, plunger 15, housing 3, inner cylindrical boring of the lower member 5' of sleeve like housing 5 with respect to any other of these members or surfaces and/or with respect to the ideal position of axis A of the whole drilling unit, such misalignment will not cause any wedging or jamming of the plunger within boring 50. The effect of such clearances is especially note-worthy in view of the fact that in the absence of such clearances even a very slight misalignment would result in a jamming or blocking of plunger 15 within a cylinder, in which it reciprocates, or of spindle housing 3 within housing 5. These clearances allow for a slight tilting of the unit comprising spindle housing 3 and plunger 15 and therefore make very slight inaccuracies, which never can be completely avoided, harmless. Nevertheless, in view of the fact that these clearances are rather small in absolute terms, the piston 22 will correctly move the unit of housing 3, plunger 15 and head member 16 in the upward and downward directions.

Bearings for the sleeve 20, which is part of piston 22, within closing member 30 and upper member 5" of housing 5 respectively are provided by air-permeable graphite sleeves 55 and 56. The sleeves 55 and 56 are provided with annular recesses 57 and 58 at their outer cylindrical surfaces. The annular recesses, as can be seen from FIG. 5 are connected to an air supply line 60 in the upper member 5" of housing 5 and extending through closure member 30. The pressurized air supplied through supply line 60 permeates the air-permeable graphite sleeves 55, 56, and thus creates an air cushion at their interior cylindrical surfaces and thus provides an air bearing for the sleeve 20 or piston 22 respectively.

Thus, practically the only point, where any metal surfaces are tightly fitted into each other and thereby generate frictional resistance to the upward and downward movement of the mentioned unit, is the outer surface of flange 21 within enlarged cylinder portion 25 of upper member 5" of housing 5. All other bearings, i.e. the bearing of the sleeve 20 within the graphite sleeves 55 and 56, the bearing of the housing 3 within lower member 5' of housing 5, are friction-less air bearings. At the same time, as indicated above, clearances 51 and 52 may allow for certain unavoidable misalignments. In this manner, a highly linear non-sticking or non-jerking respectively low friction spindle drive means is provided. It is essential to note that friction-less air bearing is made possible by the fact that unavoidable inaccuracies are compensated or allowed by clearances 51, 52.

We claim:

1. Drilling unit apparatus having a pre-determined reference axis, said apparatus comprising:
   a housing (5) affixed to a carrier member in concentric alignment with said predetermined axis;
   drilling spindle housing means (3) axially moveable in a bidirectional manner along said predetermined axis within said housing (5);
   a drilling spindle (2) rotatably received within said spindle housing means and driven by driving means (12);
   plunger means having an elongated plunger with first and second ends, a flange at said first end, and a head member at said second end, said flange being affixed to said drilling spindle housing means (3), said plunger means being in concentric alignment with said predetermined axis, and said plunger means being axially moveable in a bidirectional manner along said axis and in unison with said drilling spindle housing means (3) within said housing (5);
   piston means (22) slideably received within said housing (5) in concentric alignment with said predetermined axis, said piston means having an elongated sleeve-like member with an elongated bore in concentric aligned relationship with said predetermined axis, said plunger being disposed within said bore; means for operatively moving said piston means in a predetermined contacting relationship with said plunger means to move said plunger means and said spindle housing means in said unison therewith and along said axis in said bidirectional manner;
   a first clearance (51) between said plunger and said bore, said first clearance being normal to said axis in an omnidirectional manner to allow a predetermined relative limited first movement between said plunger and said piston means within said first clearance; and
   a second clearance (52) between said piston means and a recess defined by the space between said flange and said head member, said second clearance being in the direction of said axis (A) to allow a predetermined relative limited second movement between said plunger and said piston means in said second clearance;
   said piston means (22) further having an outer piston flange affixed to said sleeve member (20),
   said housing having an enlarged cylinder portion, said piston flange (21) being moveable in said bidirectional manner along said axis within said enlarged cylinder portion,
   said piston flange within said cylinder portion defining first and second chambers in said cylinder portion on opposite sides of said piston flange, and
   pneumatic supply means connected to said first and second chambers for operating said piston means in said bidirectional manner; and
   said pneumatic supply means further having:
      first and second air supply lines (31, 32) connected to said first and second chambers, respectively, and
      a control system having a servo unit (35) and a positionable controlling element for controlling said servo unit, said servo unit providing a difference of pressure in said first and second lines in response to the position of said controlling element.

2. Drilling unit apparatus according to claim 1 wherein said control system further comprises:
   a control unit (40) for controlling the position of said controlling element; and
   transducer means for providing an input signal to said control unit indicative of the position of said piston means along said axis, said control unit in response to said input signal providing an output signal for positioning said controlling element of said servo unit.

* * * * *